(12) United States Patent
Nakamura et al.

(10) Patent No.: US 8,174,168 B2
(45) Date of Patent: May 8, 2012

(54) PIEZOELECTRIC POWER GENERATING DEVICE

(75) Inventors: Kimitoshi Nakamura, Yasu (JP); Tetsuo Takeshima, Yasu (JP); Kenichi Takahashi, Omihachiman (JP); Masanaga Nishikawa, Kanazawa (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 12/891,130

(22) Filed: Sep. 27, 2010

(65) Prior Publication Data

US 2011/0012479 A1  Jan. 20, 2011

Related U.S. Application Data

(63) Continuation of application No. PCT/JP2009/001437, filed on Mar. 30, 2009.

(30) Foreign Application Priority Data

Apr. 1, 2008  (JP) ................................. 2008-094848

(51) Int. Cl.
  *H01L 41/113* (2006.01)
(52) U.S. Cl. ...................................... 310/339
(58) Field of Classification Search .................. 310/339
  See application file for complete search history.

(56) References Cited

U.S. PATENT DOCUMENTS

| | | | | |
|---|---|---|---|---|
| 4,093,885 A | * | 6/1978 | Brown | 310/331 |
| 4,387,318 A | * | 6/1983 | Kolm et al. | 310/330 |
| 4,510,484 A | | 4/1985 | Snyder | |
| 6,252,336 B1 | * | 6/2001 | Hall | 310/339 |
| 7,212,104 B2 | | 5/2007 | Haswell et al. | |
| 7,504,763 B2 | | 3/2009 | Haswell et al. | |
| 2008/0079333 A1 | * | 4/2008 | Ulm et al. | 310/339 |
| 2009/0211353 A1 | * | 8/2009 | Gao et al. | 73/146.5 |
| 2010/0148519 A1 | * | 6/2010 | Shih et al. | 290/1 R |

FOREIGN PATENT DOCUMENTS

| | | | |
|---|---|---|---|
| CA | 2136146 | * | 5/1995 |
| CN | 101262189 | * | 9/2008 |
| JP | 59-194677 A | | 11/1984 |
| JP | 07-049388 A | * | 2/1995 |
| JP | 11-258262 | * | 9/1999 |
| JP | 2003-218418 A | | 7/2003 |
| JP | 2006-501098 | | 1/2006 |
| JP | 7-49388 | | 2/2007 |
| JP | 2007-282355 A | * | 10/2007 |
| JP | 2009-247128 | * | 10/2009 |

OTHER PUBLICATIONS

PCT/JP2009/001437 Written Opinion dated Sep. 6, 2009.

* cited by examiner

*Primary Examiner* — Thomas Dougherty
(74) *Attorney, Agent, or Firm* — Dickstein Shapiro LLP (57) ABSTRACT

A piezoelectric power generating device includes a power generating element and a package member. The power generating element includes a plate-like piezoelectric element and a metal plate. The piezoelectric element has a pair of principal surfaces opposite each other. The metal plate is bonded to one of the principal surfaces of the piezoelectric element. The package member has a supporting part and a restricting part. The supporting part supports an end of the power generating element in a cantilevered manner. The restricting part is disposed opposite the piezoelectric element with the metal plate interposed therebetween. The restricting part restricts displacement of the power generating element toward the outside of the metal plate.

18 Claims, 7 Drawing Sheets

PIEZOELECTRIC POWER GENERATING DEVICE

CROSS REFERENCE TO RELATED APPLICATIONS

The present application is a continuation of International Application No. PCT/JP2009/001437, filed Mar. 30, 2009, which claims priority to Japanese Patent Application No. JP2008-094848, filed Apr. 1, 2008, the entire contents of each of these applications being incorporated herein by reference in their entirety.

FIELD OF THE INVENTION

The present invention relates to piezoelectric power generating devices, and particularly to a piezoelectric power generating device that includes a piezoelectric element having a unimorph structure and mounted in a cantilevered manner.

BACKGROUND OF THE INVENTION

Tire pressure monitoring systems (TPMS) have been known as systems that detect air pressure in car tires. Typically, a TPMS is mounted inside a tire and includes a sensor that detects air pressure and temperature, and a communication unit that wirelessly transmits data to a radio mounted on a vehicle. Therefore, the TPMS requires a power supply that supplies power to the sensor and other components.

Various power generating devices have been proposed as power supplies for use in TPMS etc. Particular attention has been focused on piezoelectric power generating devices using the piezoelectric effect. This is because piezoelectric power generating devices can be miniaturized relatively easily.

Figure 12:
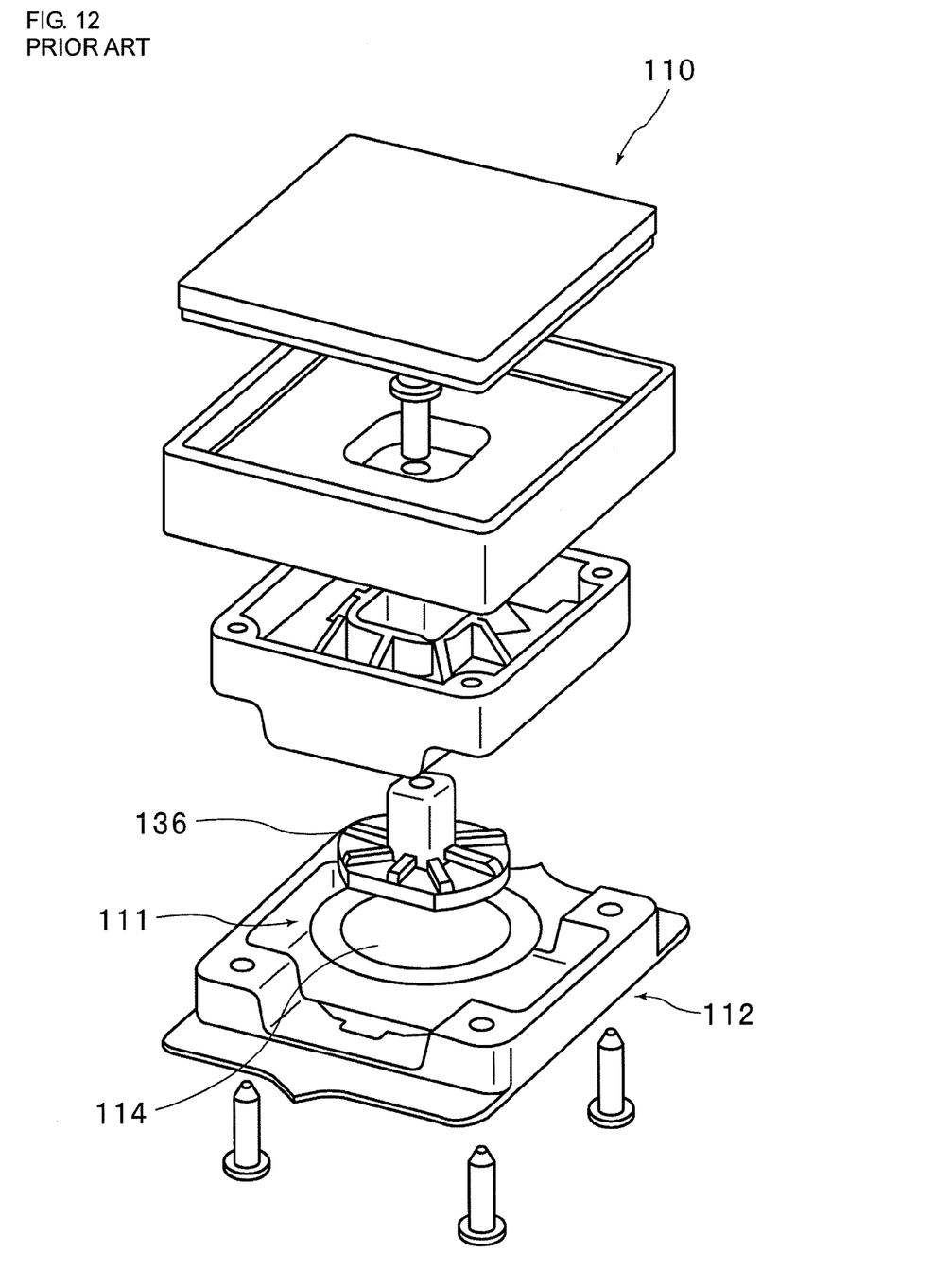
FIG. 12 is an exploded perspective view of a power generating device/sensor unit disclosed in Patent Document 1.
Figure 13:
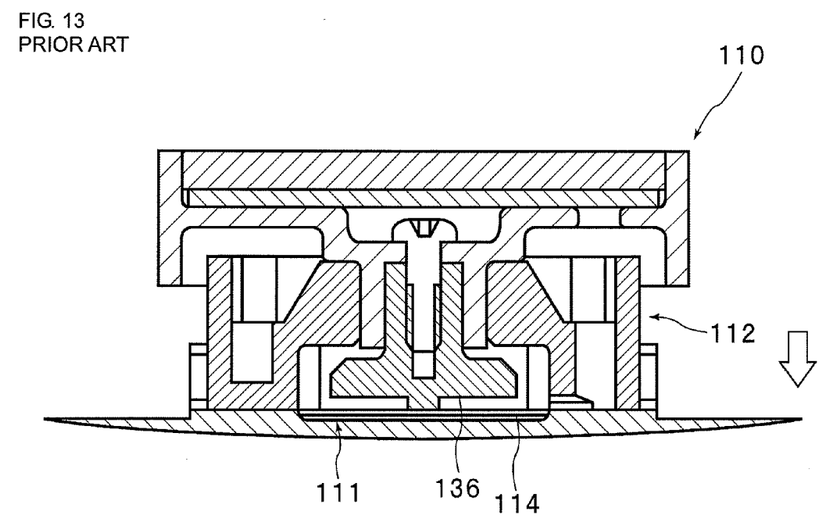
FIG. 13 is a vertical cross-sectional view of the power generating device/sensor unit at rest.

For example, as a piezoelectric power generating device for use in TPMS etc., Patent Document 1 discloses a piezoelectric power generating device that generates power in response to rotation of a tire by using periodic deformation of the tire. FIG. 12 is an exploded perspective view of a power generating device/sensor unit 110 disclosed in Patent Document 1. FIG. 13 is a vertical cross-sectional view of the power generating device/sensor unit 110 at rest. As illustrated in FIG. 12 and FIG. 13, in the power generating device/sensor unit 110, a piezoelectric element 111 is disposed inside a housing 112. The piezoelectric element 111 has a piezoceramic disc 114, on which an actuator 136 is disposed. When the tire rotates, centrifugal force acts on the actuator 136 and urges it against the piezoceramic disc 114. This causes the piezoceramic disc 114 to deflect. When an area of the tire adjacent to the power generating device/sensor unit 110 comes into contact with the ground, the centrifugal force experienced by the actuator 136 is reduced to substantially zero. This causes a reduction in urging force experienced by the piezoceramic disc 114 under the action of the actuator 136. Thus, in response to rotation of the tire, the centrifugal force applied to the actuator 136 periodically changes. As a result, the piezoceramic disc 114 vibrates and the power generating device/sensor unit 110 generates power.

Figure 14:
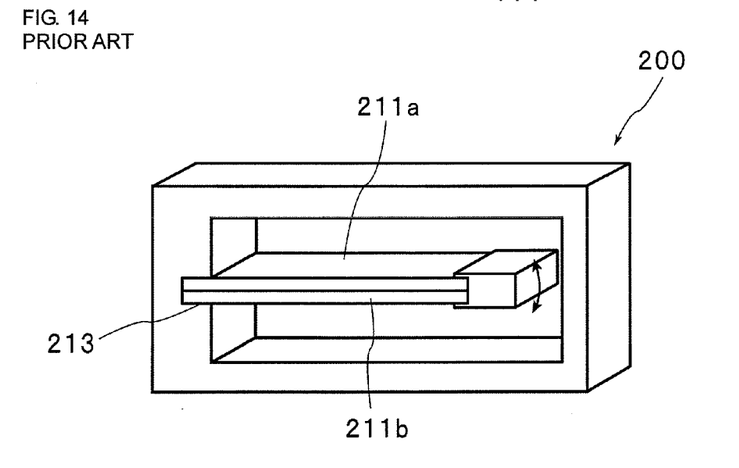
FIG. 14 illustrates a structure of main part of a power generator disclosed in Patent Document 2.

Patent Document 2 discloses a power generating device 200 illustrated in FIG. 14. As illustrated in FIG. 14, the power generating device 200 includes a piezoelectric element 211a and a metal plate 211b bonded to the piezoelectric element 211a and serving as an extraction electrode. The piezoelectric element 211a and the metal plate 211b are supported by a fixed part 213 in a cantilevered manner.

Patent Document 1: Japanese Unexamined Patent Application Publication (Translation of PCT Application) No. 2006-501098
Patent Document 2: Japanese Unexamined Patent Application Publication No. 7-49388

Since the piezoelectric power generating device disclosed in Patent Document 1 has a complex structure, it is difficult and expensive to manufacture this piezoelectric power generating device.

The power generator disclosed in Patent Document 2 has a structure simpler than that of the piezoelectric power generating device disclosed in Patent Document 1. However, the power generator disclosed in Patent Document 2 suffers from insufficient mechanical strength. Therefore, sufficient mechanical durability cannot be achieved in such applications as TPMS where relatively large force is applied to the piezoelectric element.

SUMMARY OF THE INVENTION

An object of the present invention is to provide a piezoelectric power generating device that has a simple structure and excellent mechanical durability.

A power generating device according to the present invention includes a power generating element and a package member. The power generating element includes a plate-like piezoelectric element and a metal plate. The piezoelectric element has a pair of principal surfaces opposite each other. The metal plate is bonded to one of the principal surfaces of the piezoelectric element. The package member has a supporting part and a restricting part. The supporting part supports an end of the power generating element in a cantilevered manner. The restricting part is disposed opposite the piezoelectric element with the metal plate interposed therebetween. The restricting part restricts displacement of the power generating element toward the outside of the metal plate.

According to a specific aspect of the present invention, the package member has a side wall serving as the supporting part, a bottom wall serving as the restricting part, and a ceiling disposed opposite the bottom wall with the power generating element interposed therebetween; and a distance between the power generating element and the bottom wall is smaller than a distance between the power generating element and the ceiling.

According to another specific aspect of the present invention, the restricting part has a contact portion that is in contact with a surface of the metal plate remote from the piezoelectric element.

According to another specific aspect of the present invention, the contact portion is in contact with the metal plate at a free end of the power generating element.

According to another specific aspect of the present invention, the contact portion biases the power generating element toward the outside of the piezoelectric element.

According to another specific aspect of the present invention, the piezoelectric power generating device further includes shock-absorbing members disposed between the package member and the power generating element.

According to another specific aspect of the present invention, the piezoelectric power generating device further includes a conductive layer bonded to the other of the principal surfaces of the piezoelectric element.

According to another specific aspect of the present invention, the piezoelectric element includes a piezoelectric body substantially made of piezoceramic.

The piezoelectric power generating device according to the present invention may be mounted to an inner surface of a tire.

In the present invention, since the restricting part restricts displacement of the power generating element toward the outside of the metal plate, the piezoelectric element is prevented from being subjected to large tensile stress. It is thus possible to realize a piezoelectric power generating device that is simple in structure, low in cost, and excellent in mechanical durability.

REFERENCE NUMERALS 1 piezoelectric power generating device
2 piezoelectric power generating device
3 piezoelectric power generating device
4 piezoelectric power generating element
5 piezoelectric power generating device
10 package member
11 bottom wall (restricting part)
11b contact portion
12 side wall (supporting part)
13 ceiling (restricting part)
20 power generating element
20b free end
21 metal plate
22 piezoelectric element
23 piezoelectric body
24 electrode
25 weight
30 tire
30a inner surface of tire
40 shock-absorbing member
41 conductive layer

DETAILED DESCRIPTION OF THE INVENTION

The present invention will now be discussed by describing specific embodiments of the present invention with reference to the drawings.

First Embodiment

Figure 1:
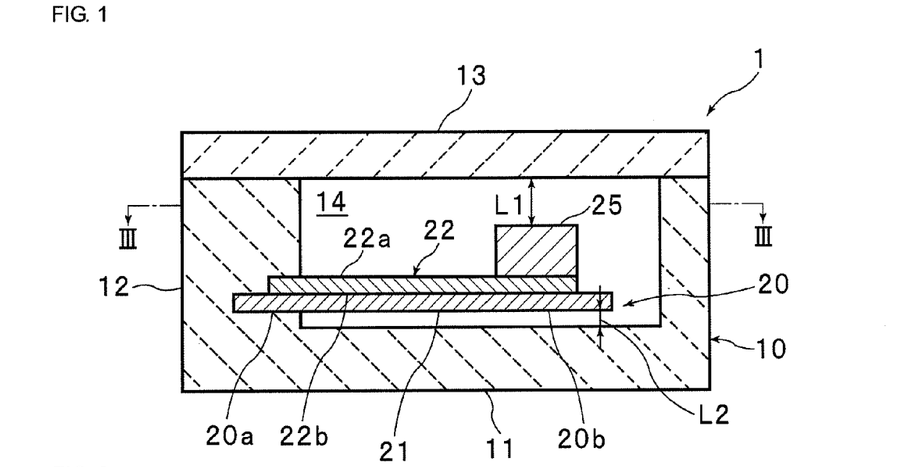
FIG. 1 is a cross-sectional view of a piezoelectric power generating device according to a first embodiment.

FIG. 1 is a cross-sectional view of a piezoelectric power generating device 1 according to a first embodiment. The piezoelectric power generating device 1 is mounted to a rotating body, such as a tire, and generates power in response to rotation of the rotating body. The piezoelectric power generating device 1 is used, for example, as a power supply for TPMS.

As illustrated in FIG. 1, the piezoelectric power generating device 1 includes a power generating element 20 and a package member 10. The power generating element 20 includes a piezoelectric element 22 having a unimorph structure, a metal plate 21, and a weight 25.

Figure 2:
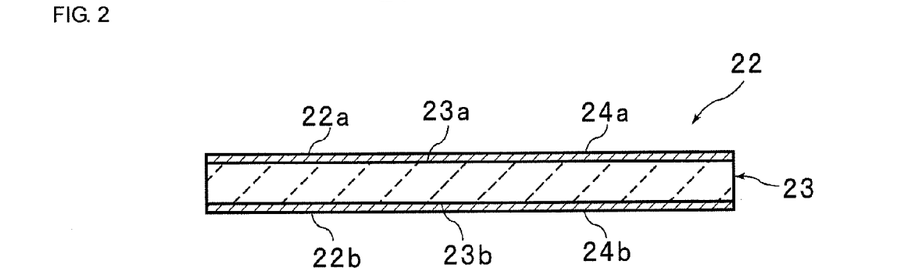
FIG. 2 is a cross-sectional view of a piezoelectric element.
Figure 3:
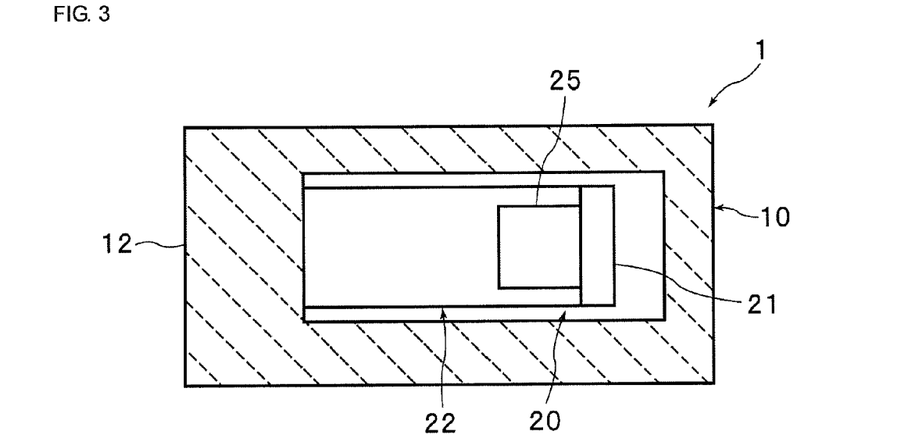
FIG. 3 is a plan view taken along arrow III-III in FIG. 1.

As illustrated in FIG. 1 and FIG. 2, the piezoelectric element 22 is a plate-like member having a first principal surface 22a and a second principal surface 22b. As illustrated in FIG. 3, the piezoelectric element 22 is rectangular in plan view. The shape of the piezoelectric element 22 in plan view is not limited to any specific shape.

As illustrated in FIG. 2, the piezoelectric element 22 includes a plate-like piezoelectric body 23, an electrode 24a, and an electrode 24b. Note that the electrode 24a and the electrode 24b are not shown in FIG. 1 etc.

The piezoelectric body 23 may be made of, for example, piezoceramic. Examples of the piezoceramic include lead zirconate titanate ceramic. The piezoelectric body 23 is polarized in the thickness direction.

The piezoelectric body 23 has a first principal surface 23a and a second principal surface 23b opposite each other. The electrode 24a is disposed on the first principal surface 23a of the piezoelectric body 23. The electrode 24b is disposed on the second principal surface 23b of the piezoelectric body 23. The electrodes 24a and 24b are formed of conductive material, such as metal or alloy. A method for forming the electrodes 24a and 24b is not limited to a specific one. For example, the electrode 24 may be formed by a thin-film forming method, such as baking of conductive paste, deposition, sputtering, or plating.

The metal plate 21 is bonded to the second principal surface 22b of the piezoelectric element 22. Specifically, the metal plate 21 is bonded to the electrode 24b. The metal plate 21 and the electrode 24b may or may not be insulated from each other.

The thicknesses of the piezoelectric element 22 and metal plate 21 are not limited to specific values. The piezoelectric element 22 and the metal plate 21 preferably have thicknesses that allow the power generating element 20 to vibrate in response to rotation of the rotating body to which the piezoelectric power generating device 1 is mounted.

In the present embodiment, the weight 25 is mounted to an end 20b of the piezoelectric element 22. The weight 25 is provided for facilitating the vibration of the power generating element 20. The weight 25 is optional in the present invention.

The power generating element 20 is supported in a cantilevered manner by the package member 10. The package member 10 is made of insulating material. Examples of the material of the package member 10 include insulating ceramic.

The package member 10 has a bottom wall 11 serving as a restricting part, a side wall 12 serving as a supporting part, and a ceiling 13 opposite the bottom wall 11. The bottom wall 11, the side wall 12, and the ceiling 13 define a space 14 which accommodates the power generating element 20.

In the present embodiment, the bottom wall 11 and the side wall 12 are formed as an integral part. The ceiling 13 is formed as a part separate from the side wall 12 and the bottom wall 11.

The side wall 12 serves as a supporting part to support, in a cantilevered manner, an end 20a of the power generating element 20 in the longitudinal direction. Thus, when the piezoelectric power generating device 1 is at rest, the power generating element 20 is substantially parallel to the bottom wall 11 and the ceiling 13.

In the present embodiment, a distance L2 between the power generating element 20 and the bottom wall 11 is set to be smaller than a distance L1 between the power generating element 20 and the ceiling 13. The distance L2 may be set to zero.

Power generation performed in the piezoelectric power generating device 1 will now be described with reference primarily to FIG. 4 and FIG. 5. Here, a description will be given of an example where the piezoelectric power generating device 1 is mounted to an inner surface 30a of a tire 30.

Figure 4:
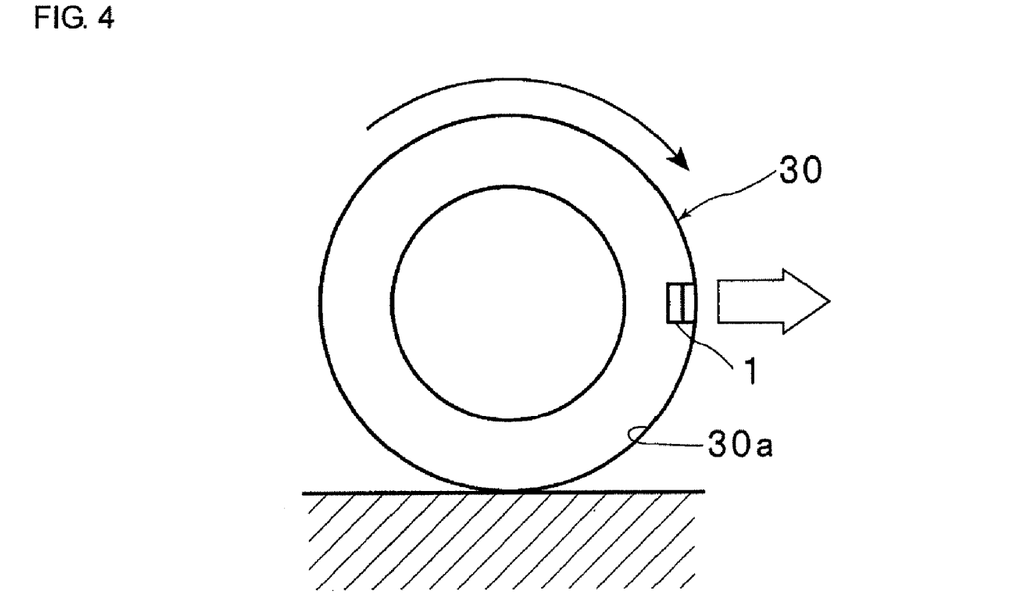
FIG. 4 is a schematic diagram for explaining force applied to the piezoelectric power generating device during rotation of a tire.
Figure 5:
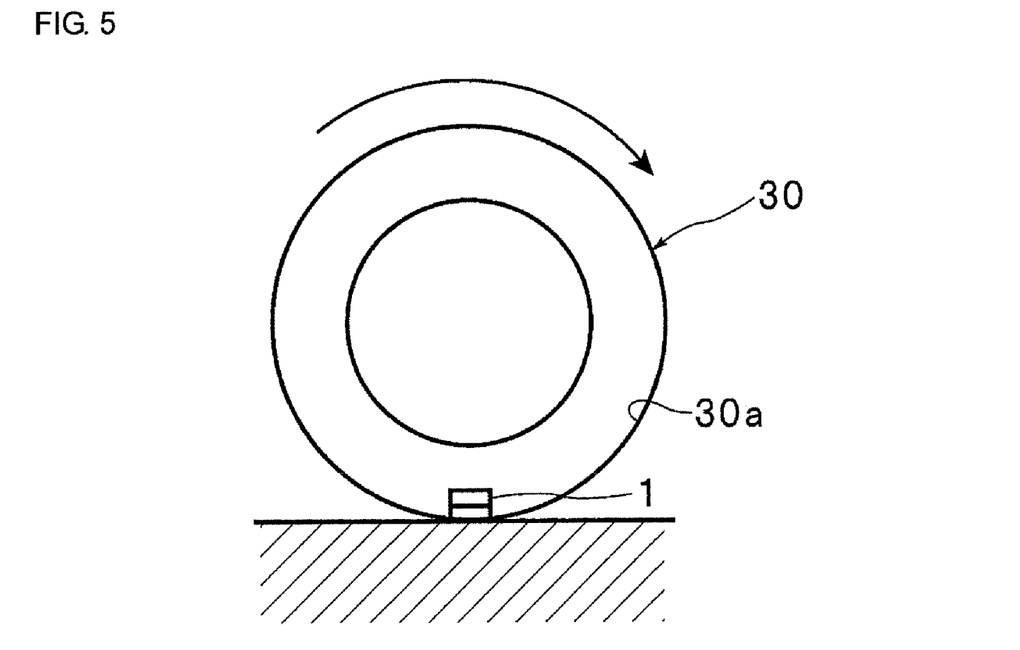
FIG. 5 is another schematic diagram for explaining force applied to the piezoelectric power generating device during rotation of the tire.

As illustrated in FIG. 4, when an area of the tire 30 adjacent to the piezoelectric power generating device 1 is not in contact with the ground, centrifugal force is applied to the piezoelectric power generating device 1 as the tire 30 rotates. On the other hand, as illustrated in FIG. 5, when the area of the tire 30 adjacent to the piezoelectric power generating device 1 is in contact with the ground, centrifugal force is not applied to the piezoelectric power generating device 1 even during rotation of the tire 30. Thus, during rotation of the tire 30, switching repeatedly takes place between two different states, i.e., a state in which centrifugal force is applied to the piezoelectric power generating device 1 and a state in which no centrifugal force is applied to the piezoelectric power generating device 1. Since this causes the power generating element 20 to vibrate, power can be taken out of the piezoelectric element 22 by the piezoelectric effect.

Figures 6A, 6B:
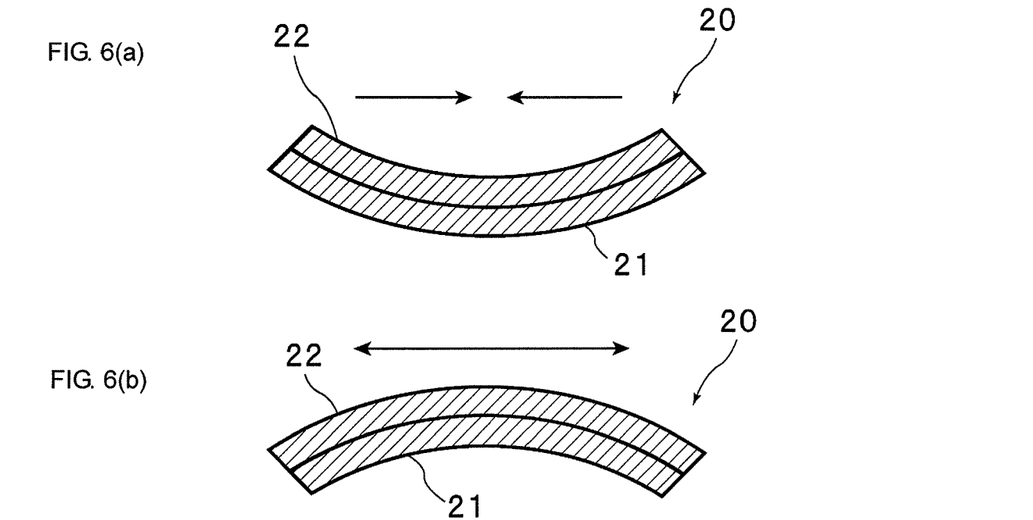
FIG. 6 is a cross-sectional view illustrating the piezoelectric element in a state of vibration.

The piezoelectric element 22 is more sensitive to tensile stress than to compressive stress. Specifically, the piezoelectric element 22 exhibits brittleness when subjected to tensile stress. For example, as illustrated in FIG. 6(a), when the power generating element 20 is displaced such that it becomes convex toward the outside of the metal plate 21, the piezoelectric element 22 is subjected to compressive stress but is less likely to be damaged. On the other hand, as illustrated in FIG. 6(b), when the power generating element 20 is displaced such that it becomes convex toward the outside of the piezoelectric element 22, the piezoelectric element 22 is subjected to tensile stress and is likely to be damaged. This tendency is prominent particularly when the piezoelectric body 23 is substantially made of piezoceramic.

For example, in the power generating device 200 illustrated in FIG. 14, a distance between the piezoelectric element 211a and a package is substantially the same as that between the metal plate 211b and the package. This means that the piezoelectric element 211a and the metal plate 211b can be significantly displaced in both directions, i.e., in a direction that applies tensile stress to the piezoelectric element 211a and in a direction that applies compressive stress to the piezoelectric element 211a. Therefore, in the power generating device 200, the piezoelectric element 211a and the metal plate 211b may be significantly displaced in a direction that applies tensile stress to the piezoelectric element 211a, so that large tensile stress may be applied to the piezoelectric element 211a.

On the other hand, in the present embodiment, the distance L2 between the power generating element 20 and the bottom wall 11 is set to be smaller than the distance L1 between the power generating element 20 and the ceiling 13. Therefore, in the present embodiment, the bottom wall 11 serves as a restricting part and restricts significant displacement of the power generating element 20 toward the outside of the metal plate 21, i.e., in a direction that applies tensile stress to the piezoelectric element 22. This prevents application of large tensile stress to the piezoelectric element 22. Thus, it is possible to improve the mechanical durability of the piezoelectric power generating device 1.

As described above, when the piezoelectric body 23 is substantially made of piezoceramic, the piezoelectric element 22 is particularly brittle when subjected to tensile stress. Therefore, the technique of the present embodiment is effective particularly when the piezoelectric body 23 is substantially made of piezoceramic.

As another method for restricting displacement of the power generating element 20 toward the outside of the metal plate 21, i.e., in a direction that applies tensile stress to the piezoelectric element 22, it is possible to set both the distance L2 between the power generating element 20 and the bottom wall 11 and the distance L1 between the power generating element 20 and the ceiling 13 to be small. However, if both the distances L1 and L2 are set to be small, the amount of displacement of the power generating element 20 is small. This results in a tendency to generate less power.

In the present embodiment, the distance L2 between the power generating element 20 and the bottom wall 11 is set to be small, but the distance L1 between the power generating element 20 and the ceiling 13 is set to be large. Therefore, the power generating element 20 can be significantly displaced toward the outside of the piezoelectric element 22. Thus, as compared to the case where both the distances L1 and L2 are set to be small, the amount of power generated by the power generating element 20 can be larger. This means that in the present embodiment, it is possible to generate a relatively large amount of power while improving the mechanical durability of the piezoelectric power generating device 1.

The direction of an electric field generated in the piezoelectric body 23 when the power generating element 20 is displaced in the direction that applies tensile stress to the piezoelectric element 22 is opposite that when the power generating element 20 is displaced in the direction that applies compressive stress to the piezoelectric element 22. Therefore, as in the case of the present embodiment, by preventing the power generating element 20 from being easily displaced in the direction that applies tensile stress to the piezoelectric element 22, it is possible in the piezoelectric body 23 to suppress generation of electric fields in opposite directions. Thus, it is possible to suppress depolarization in the piezoelectric element 22.

To suppress depolarization, it is preferable that the distance L2 between the power generating element 20 and the bottom wall 11 be small. To restrict displacement of the power generating element 20 in the direction that applies tensile stress to the piezoelectric body 23, it is also preferable that the distance L2 be small. However, when the distance L2 is small, since displacement of the power generating element 20 is restricted, power generation efficiency tends to be reduced. Therefore, to achieve high power generation efficiency, it is preferable that the distance L2 be long to some extent.

Hereinafter, other preferred embodiments of the present invention will be described in detail with reference primarily to FIG. 7 to FIG. 10. In the following description, components having substantially the same functions as those in the first embodiment are denoted by the same reference numerals and their description will be omitted.

Second Embodiment

Figure 7:
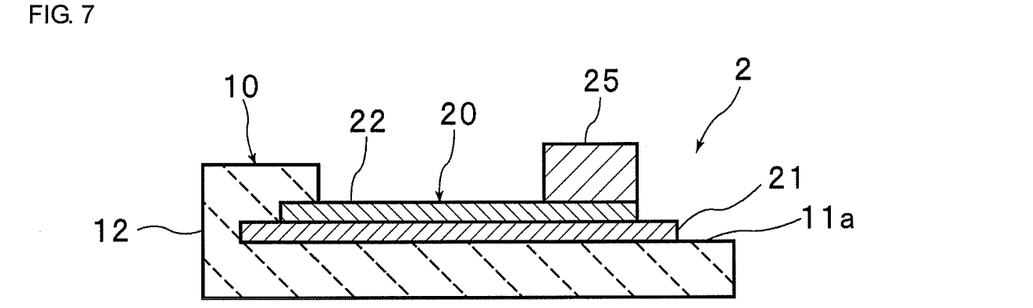
FIG. 7 is a cross-sectional view of a piezoelectric power generating device according to a second embodiment.

FIG. 7 is a cross-sectional view of a piezoelectric power generating device 2 according to a second embodiment.

In the first embodiment described above, the package member 10 has the ceiling 13, as well as the bottom wall 11 and the side wall 12. However, the package member 10 does not necessarily need to have the ceiling 13.

The power generating element 20 may be disposed to be in contact with the bottom wall 11. Specifically, as illustrated in FIG. 7, the power generating element 20 may be disposed such that the metal plate 21 is in contact with a surface 11a of the bottom wall 11.

With this structure, it is possible to reliably inhibit the displacement of the power generating element 20 toward the outside of the metal plate 21, i.e., in the direction that applies tensile stress to the piezoelectric element 22. Thus, the mechanical durability of the piezoelectric power generating device 2 can be further improved.

Compared to a piezoelectric power generating device 3 of a third embodiment described below, the piezoelectric power generating device 2 of the present embodiment has a simpler structure and is easier and cheaper to manufacture.

Third Embodiment

Figure 8:
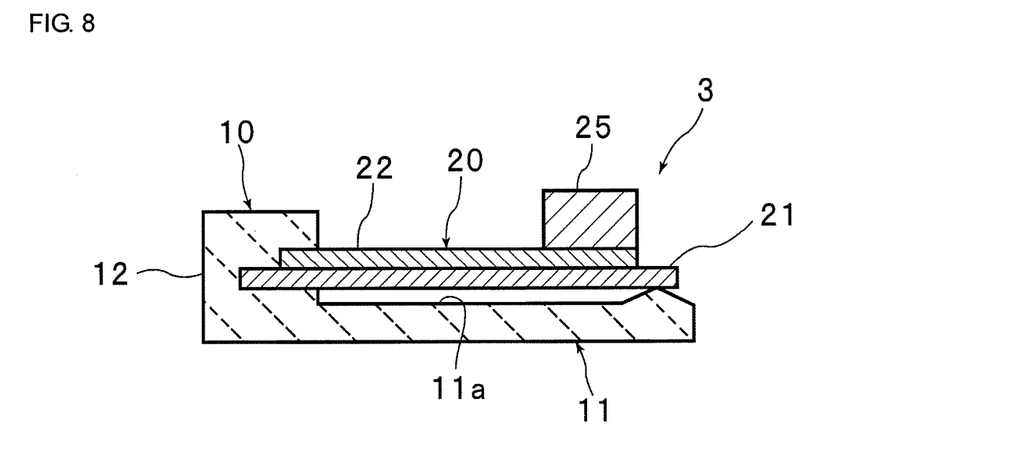
FIG. 8 is a cross-sectional view of a piezoelectric power generating device according to a third embodiment.

FIG. 8 is a cross-sectional view of the piezoelectric power generating device 3 according to the third embodiment.

In the second embodiment described above, the entire surface of the power generating element 20 is in contact with the bottom wall 11. However, the power generating element 20 may be partially in contact with the bottom wall 11. For example, the power generating element 20 may be in contact with the bottom wall 11 at the free end 20b.

In the present embodiment illustrated in FIG. 6, the power generating element 20 is disposed above the surface 11a of the bottom wall 11. There is an air gap between the power generating element 20 and the surface 11a. The bottom wall 11 has a raised contact portion 11b, which is in contact with the free end 20b of the power generating element 20.

When the bottom wall has a contact portion in contact with the power generating element 20, it is preferable, as in the present embodiment, that the contact portion be in contact with the free end of the power generating element. This is because this structure makes it possible to effectively restrict the displacement of the power generating element in a direction that applies tensile stress to the piezoelectric body.

Fourth Embodiment

In the second embodiment described above, the power generating element 20 is in contact with the bottom wall 11. However, as in the case of a piezoelectric power generating element 4 illustrated in FIG. 9, the power generating element 20 may be in contact with the ceiling 13. In other words, the piezoelectric power generating device 4 may be mounted to the inner surface of the tire either at the bottom wall 11 or at the ceiling 13.

Figure 9:
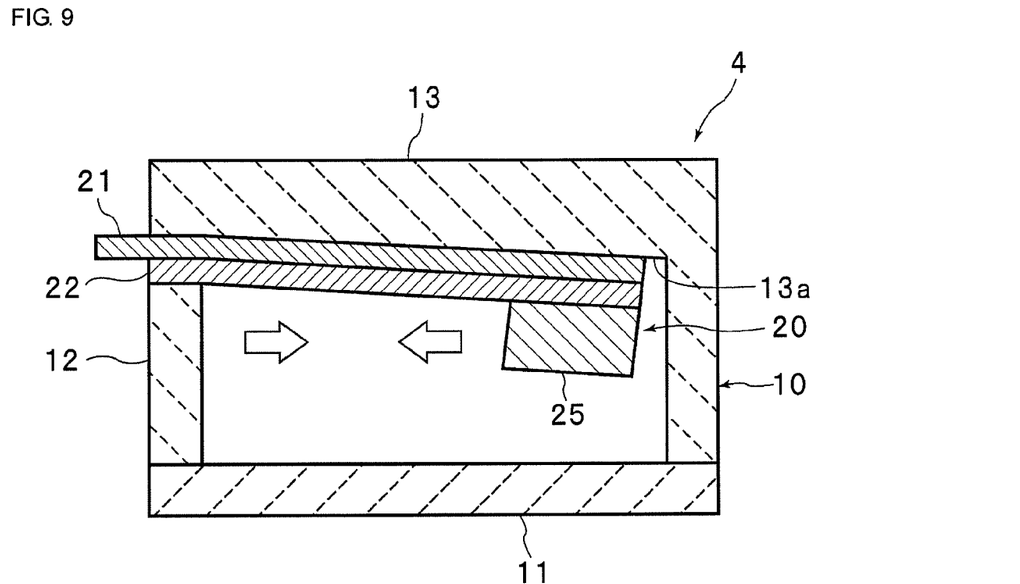
FIG. 9 is a cross-sectional view of a piezoelectric power generating device according to a fourth embodiment.

As illustrated in FIG. 9, a surface of the package member 10 in contact with the power generating element 20 does not need to be horizontal. In the present embodiment, a surface 13a of the ceiling 13 inclines along the power generating element 20 that extends from the side wall 12. Thus, the ceiling 13 serving as a contact portion biases the power generating element 20 toward the outside of the piezoelectric element 22. This means that the piezoelectric element 22 is always under compressive stress. Therefore, it is possible to reliably inhibit application of tensile stress to the piezoelectric element 22 and improve the mechanical durability of the piezoelectric power generating device 4.

Fifth Embodiment

Figure 10:
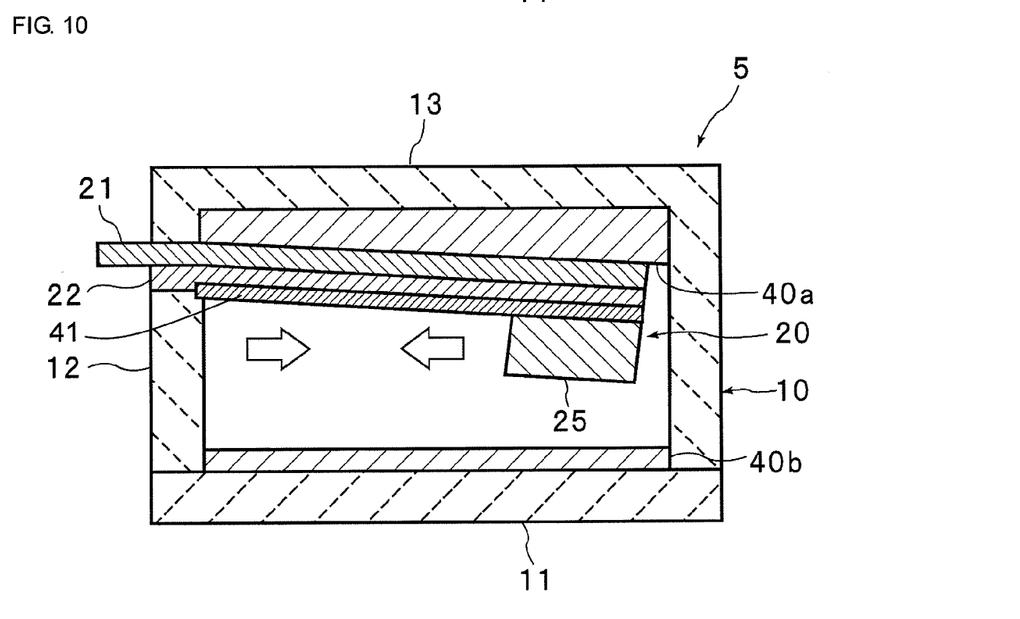
FIG. 10 is a cross-sectional view of a piezoelectric power generating device according to a fifth embodiment.

FIG. 10 is a cross-sectional view of a piezoelectric power generating device 5 according to a fifth embodiment. As illustrated in FIG. 10, a shock-absorbing member 40a and a shock-absorbing member 40b may be disposed between the power generating element 20 and the package member 10. Specifically, the shock-absorbing member 40a is disposed between the metal plate 21 and the ceiling 13 serving as a restricting part. The shock-absorbing member 40b is disposed on an inner surface of the bottom wall 11.

With the shock-absorbing members 40a and 40b, a direct collision between the power generating element 20 and the package member 10 can be avoided. This makes it possible to effectively reduce force applied to the power generating element 20. Thus, the mechanical durability of the piezoelectric power generating device 5 can be further improved.

The shock-absorbing member 40 is, for example, a silicon rubber member.

As illustrated in FIG. 10, a conductive layer 41 may be bonded to a surface of the piezoelectric element 22 remote from the metal plate 21. In other words, the conductive layer 41 may be bonded to the surface of the electrode 24a. This makes it possible to ensure reliable electric connection even when, for example, the piezoelectric element 22 is cracked.

The material of the conductive layer 41 is not limited to a specific one. For example, the conductive layer 41 may be made of metal or alloy.

It is preferable that the conductive layer 41 be a relatively thick metal or alloy foil. This is to ensure reliable electric connection.

Modifications

Figure 11:
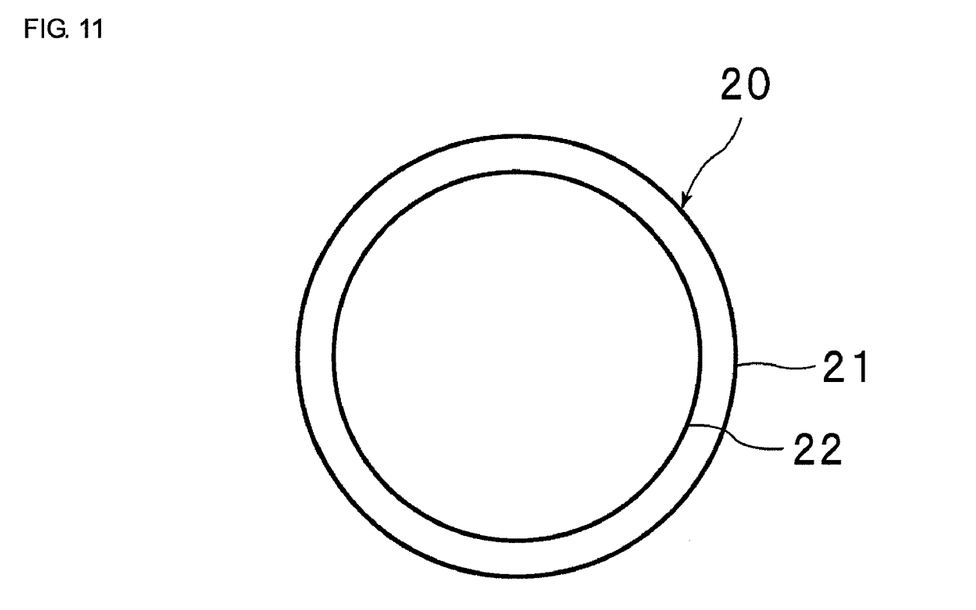
FIG. 11 is a cross-sectional view of a modified piezoelectric power generating device.

In the embodiments described above, the piezoelectric element 22 has a rectangular plate-like shape. However, the shape of the piezoelectric element 22 in plan view is not limited to a specific one. For example, as illustrated in FIG. 11, the piezoelectric element 22 may be circular in plan view.

The invention claimed is:

1. A piezoelectric power generating device comprising:
   a power generating element that includes a piezoelectric element having first and second principal surfaces opposite each other, and a metal plate adjacent to one of the first and second principal surfaces of the piezoelectric element; and
   a package member that includes a supporting part supporting an end of the power generating element in a cantilevered manner, and a restricting part disposed opposite the piezoelectric element with the metal plate interposed therebetween and configured to restrict displacement of the power generating element in a direction toward the metal plate,
   wherein the package member has a side wall configured as the supporting part, a bottom wall configured as the restricting part, and a ceiling disposed opposite the bottom wall with the power generating element interposed therebetween; and a distance between the power generating element and the bottom wall is smaller than a distance between the power generating element and the ceiling.

2. The piezoelectric power generating device according to claim 1, wherein the restricting part has a contact portion that is in contact with a surface of the metal plate.

3. The piezoelectric power generating device according to claim 1, further comprising at least one shock-absorbing member disposed between the package member and the power generating element.

4. The piezoelectric power generating device according to claim 1, further comprising first and second shock-absorbing member disposed on opposite sides of the power generating element such that the first and second shock absorbing members are each between the package member and the power generating element.

5. The piezoelectric power generating device according to claim 1, further comprising a conductive layer adjacent to the other of the first and second principal surfaces of the piezoelectric element such that the piezoelectric element is positioned between the metal plate and the conductive layer.

6. The piezoelectric power generating device according to claim 1, wherein the piezoelectric element includes a piezoelectric body substantially made of piezoceramic.

7. The piezoelectric power generating device according to claim 1, wherein the piezoelectric power generating device is configured to be mounted to an inner surface of a tire.

8. The piezoelectric power generating device according to claim 1, wherein the piezoelectric element is plate-shaped.

9. The piezoelectric power generating device according to claim 1, wherein the piezoelectric element is polarized in a thickness direction thereof.

10. The piezoelectric power generating device according to claim 1, further comprising a weight mounted to a free end of the piezoelectric element.

11. The piezoelectric power generating device according to claim 1, wherein the piezoelectric element is circular.

12. A piezoelectric power generating device comprising:
a power generating element that includes a piezoelectric element having first and second principal surfaces opposite each other, and a metal plate adjacent to one of the first and second principal surfaces of the piezoelectric element; and
a package member that includes a supporting part supporting an end of the power generating element in a cantilevered manner, and a restricting part disposed opposite the piezoelectric element with the metal plate interposed therebetween and configured to restrict displacement of the power generating element in a direction toward the metal plate,
wherein the package member has a side wall configured as the supporting part, a ceiling configured as the restricting part, and a bottom wall disposed opposite the ceiling with the power generating element interposed therebetween; and
a distance between the power generating element and the ceiling is smaller than a distance between the power generating element and the bottom wall.

13. The piezoelectric power generating device according to claim 12, further comprising at least one shock-absorbing member disposed between the package member and the power generating element.

14. The piezoelectric power generating device according to claim 12, further comprising a first shock-absorbing member disposed between the ceiling and the power generating element and a second shock-absorbing member disposed between the bottom wall and the power generating element.

15. The piezoelectric power generating device according to claim 12, further comprising a conductive layer adjacent to the other of the first and second principal surfaces of the piezoelectric element such that the piezoelectric element is positioned between the metal plate and the conductive layer.

16. The piezoelectric power generating device according to claim 12, further comprising a weight mounted to a free end of the piezoelectric element.

17. A piezoelectric power generating device comprising:
a power generating element that includes a piezoelectric element having first and second principal surfaces opposite each other, and a metal plate adjacent to one of the first and second principal surfaces of the piezoelectric element; and
a package member that includes a supporting part supporting an end of the power generating element in a cantilevered manner, and a restricting part disposed opposite the piezoelectric element with the metal plate interposed therebetween and configured to restrict displacement of the power generating element in a direction toward the metal plate,
wherein the restricting part has a contact portion that is in contact with a surface of the metal plate, and
wherein the contact portion biases the power generating element in a direction toward the piezoelectric element.

18. The piezoelectric power generating device according to claim 17, wherein the contact portion is in contact with the metal plate at a free end of the power generating element.

* * * * *